US010782366B2

(12) United States Patent
Stewart

(10) Patent No.: US 10,782,366 B2
(45) Date of Patent: Sep. 22, 2020

(54) MULTI-CHANNEL SENSOR OUTPUT SIGNAL PROTOCOLS

(71) Applicant: Allegro MicroSystems, LLC, Manchester, NH (US)

(72) Inventor: Logan Stewart, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 314 days.

(21) Appl. No.: 15/729,943

(22) Filed: Oct. 11, 2017

(65) Prior Publication Data

US 2019/0107587 A1    Apr. 11, 2019

(51) Int. Cl.
| | |
|---|---|
| G01R 33/09 | (2006.01) |
| H01L 43/04 | (2006.01) |
| G01D 5/14 | (2006.01) |
| G01R 33/07 | (2006.01) |
| G01D 5/245 | (2006.01) |
| G01D 5/246 | (2006.01) |

(52) U.S. Cl.
CPC ........... *G01R 33/096* (2013.01); *G01D 5/142* (2013.01); *G01D 5/2451* (2013.01); *G01R 33/07* (2013.01); *H01L 43/04* (2013.01); *G01D 5/246* (2013.01)

(58) Field of Classification Search
CPC .. G01R 31/346; G01R 15/202; G01R 22/066; G06F 19/00; G06F 11/03; G06F 11/30; G06F 17/40; G01H 11/08; G01B 5/28; H02H 7/09
USPC ... 324/207.13–207.15, 200, 86, 167, 207.25, 324/654, 76.75, 76.11, 500, 750.16, 220, 324/765.01, 545, 137, 160, 177, 139, 143, 324/772; 702/35, 58, 64, 65, 113–114, 702/185; 318/778, 599, 586, 400.22, 438, 318/431, 5, 434
See application file for complete search history.

(56) References Cited

U.S. PATENT DOCUMENTS

| | | |
|---|---|---|
| 6,815,944 B2 | 11/2004 | Vig et al. |
| 8,054,071 B2 | 11/2011 | Doogue et al. |

(Continued)

OTHER PUBLICATIONS

U.S. Appl. No. 15/596,514, filed May 16, 2017, Burdette et al.

(Continued)

*Primary Examiner* — Vincent Q Nguyen
*Assistant Examiner* — Trung Nguyen
(74) *Attorney, Agent, or Firm* — Daly, Crowley, Mofford & Durkee, LLP

(57) ABSTRACT

A magnetic field sensor includes a plurality of magnetic field sensing elements operable to generate magnetic field signals indicative of a magnetic field associated with an object, a plurality of channels coupled to receive the magnetic field signals and configured to generate a respective plurality of phase separated channel signals, and an output circuit coupled to receive the plurality of phase separated channel signals and configured to generate a sensor output signal including distinguishable pulses associated with the plurality of phase separated channel signals. The sensor output signal may include a first plurality of pulses associated with a first one of the phase separated channel signals and having a first characteristic and a second plurality of pulses associated with a second one of the phase separated channel signals and having a second characteristic different than the first characteristic, such as different signals levels and/or different pulse widths.

21 Claims, 9 Drawing Sheets

(56) References Cited

U.S. PATENT DOCUMENTS

| | | |
|---|---|---|
| 8,624,588 B2 | 1/2014 | Vig et al. |
| 8,860,404 B2 | 10/2014 | Dwyer et al. |
| 9,068,859 B2 | 6/2015 | Dwyer et al. |
| 9,222,990 B2 | 12/2015 | Dwyer et al. |
| 2014/0176125 A1* | 6/2014 | Friedrich ........... G01R 33/0023 |
| | | 324/207.2 |
| 2016/0209476 A1* | 7/2016 | Feucht ............... G01R 33/0023 |
| 2017/0219662 A1 | 8/2017 | Prentice et al. |
| 2017/0336225 A1* | 11/2017 | Burdette .................. G01D 5/14 |

OTHER PUBLICATIONS

U.S. Appl. No. 15/655,377, filed Jul. 20, 2017, Kerdraon et al.
U.S. Appl. No. 15/655,383, filed Jul. 20, 2017, Kerdraon et al.
U.S. Appl. No. 15/655,390, filed Jul. 20, 2017, Pepka et al.
U.S. Appl. No. 15/655,400, filed Jul. 20, 2017, Doogue et al.
U.S. Appl. No. 15/655,403, filed Jul. 20, 2017, Doogue et al.
U.S. Appl. No. 15/695,109, filed Sep. 5, 2017, Prentice et al.

\* cited by examiner

MULTI-CHANNEL SENSOR OUTPUT SIGNAL PROTOCOLS

CROSS-REFERENCE TO RELATED APPLICATIONS

Not Applicable.

STATEMENT REGARDING FEDERALLY SPONSORED RESEARCH

Not Applicable.

FIELD

This disclosure relates generally to sensors and more particularly, to output signal protocols for magnetic field sensors having multiple processing channels.

BACKGROUND

As is known in the art, sensors are used in various types of devices to measure and monitor properties of systems in a wide variety of applications. For example, sensors have become common in products that rely on electronics in their operation, such as automobile control systems. Examples of automotive applications are the detection of ignition timing from an engine crankshaft and/or camshaft, the detection of wheel speed for anti-lock braking systems and four-wheel steering systems, and the speed and direction of transmission gears.

Some sensors monitor properties by detecting a magnetic field associated with proximity or movement of a target object with respect to one or more magnetic field sensing elements. In magnetic field sensors including multiple magnetic field sensing elements, magnetic field signals from the sensing elements can be processed by separate processing channels to generate respective phase separated signals. One such magnetic field sensor is the Allegro MicroSystems, LLC ATS605LSG Dual Output Differential Speed and Direction Sensor IC, in which the output signals from each of the processing channels are provided at respective output pins of the sensor integrated circuit (IC). In an automotive application, the sensor IC output signals can be coupled to an engine control unit (ECU) for further processing, such as detection of gear or wheel speed, direction and/or vibration.

SUMMARY

According to the disclosure, a magnetic field sensor includes a plurality of magnetic field sensing elements operable to generate a respective one or more magnetic field signals indicative of a magnetic field associated with an object, a plurality of channels coupled to receive one or more of the plurality of magnetic field signals and configured to generate a respective plurality of phase separated channel signals, and an output circuit coupled to receive the plurality of phase separated channel signals and configured to generate a sensor output signal including distinguishable pulses associated with the plurality of phase separated channel signals. With this arrangement, the number of connections (e.g., pins of a sensor IC) can be reduced without loss of functionality. Further by providing information in the sensor output signal about more than one channel signal, if one channel fails, the output signal can still convey object speed.

Features of the disclosure may include one or more of the following, alone or in combination. The sensor output signal may include a first plurality of pulses associated with a first one of the phase separated channel signals and a second plurality of pulses associated with a second one of the phase separated channel signals, wherein the first plurality of pulses has a first characteristic and the second plurality of pulses has a second characteristic different than the first characteristic. The first and second characteristics may be one or both of different signals levels and different pulse widths.

The magnetic field sensor may be provided as an integrated circuit comprising a two wire power connection and the sensor output signal provided on the two wire power connection, as a so-called two wire configuration. Alternatively, the magnetic field sensor may be provided as an integrated circuit comprising a two wire power connection and a separate output connection and the sensor output signal provided on the separate output connection, as a so-called three wire configuration.

The phase separated channel signals may include transitions indicative of a rate of movement of the object. Each channel may include a threshold detector circuit configured to compare the received magnetic field signal to a threshold level to generate the respective channel signal. For example, the threshold detector circuit may comprise a peak-referenced detector circuit or a peak-to-peak percentage threshold detector circuit. The magnetic field sensing elements may comprise one or more Hall effect elements or magnetoresistance elements. In some embodiments, the sensor includes a back bias magnet to generate a magnetic field, the object comprises a ferromagnetic object and movement of the object affects the magnetic field detected by the plurality of magnetic field sensing elements.

Also described is a method of communicating a plurality of phase separated signals over a single connection of a magnetic field sensor including generating a plurality of magnetic field signals indicative of a magnetic field associated with an object, processing the plurality of magnetic field signals with a plurality of channels configured to generate a respective plurality of phase separated channel signals, and generating a sensor output signal comprising distinguishable pulses associated with each of the plurality of phase separated channel signals for coupling to the single connection.

Features may include one or more of the following, alone or in combination. Generating the sensor output signal may include generating a first plurality of pulses associated with a first one of the phase separated channel signals and a second plurality of pulses associated with a second one of the phase separated channel signals, wherein the first plurality of pulses has a first characteristic and the second plurality of pulses has a second characteristic different than the first characteristic. In some embodiments, the first plurality of pulses has a first signal level and the second plurality of pulses has a second signal level different than the first signal level. In some embodiments, the first plurality of pulses has a first pulse width and the second plurality of pulses has a second pulse width different than the first pulse width.

In some embodiments, the sensor output signal for coupling to the single connection may be provided in the form of a current on a two wire power connection of the sensor. In other embodiments, the sensor output signal may be provided on a dedicated output connection of the sensor.

According to a further aspect, apparatus includes means for generating a plurality of magnetic field signals indicative of a magnetic field associated with movement of an object, means for generating a plurality of phase separated channel signals in response to the plurality of magnetic field signals, and output means, coupled to the channel signal generating means, for generating a sensor output signal comprising distinguishable pulses associated with each of the plurality of phase separated channel signals.

Features may include one or more of the following, alone or in combination. The output means may include means for providing the output signal with a first plurality pulses associated with a first one of the plurality of phase separated channel signals and a second plurality of pulses associated with a second one of the plurality of phase separated channel signals, wherein the first plurality of pulses has a first characteristic and the second plurality of pulses has a second characteristic different than the first characteristic. The first plurality of pulses of the sensor output signal may include a first signal level and the second plurality of pulses of the sensor output signal may include a second signal level different than the first signal level. The first plurality of pulses of the sensor output signal may include a first pulse width and the second plurality of pulses of the sensor output signal may include a second pulse width different than the first pulse width.

BRIEF DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Figure 1:
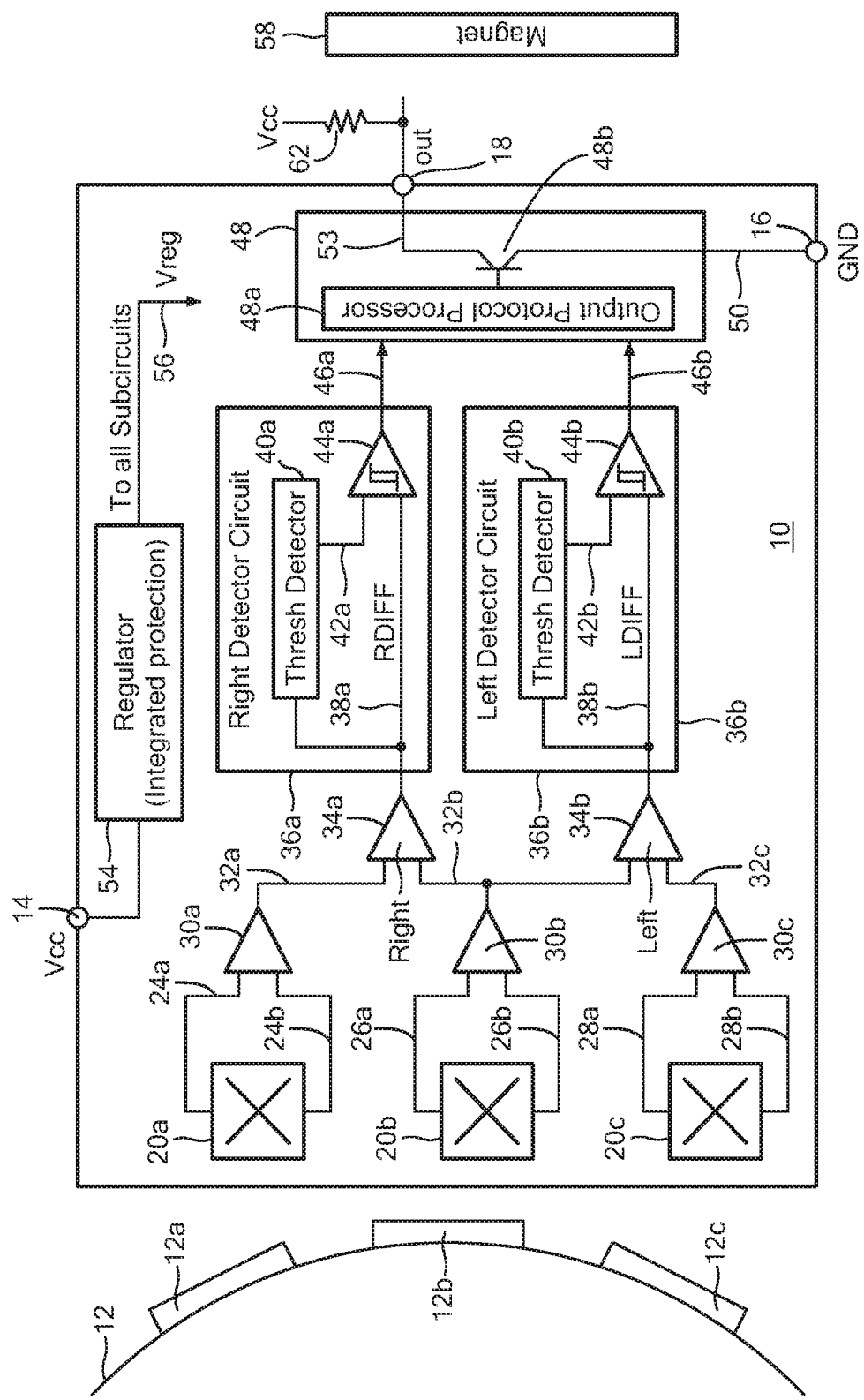
FIG. 1 shows a three wire magnetic field sensor according to the disclosure.

Before describing the present invention, some introductory concepts and terminology are explained. As used herein, the term "rotation detector" is used to describe a circuit that includes at least one "magnetic field sensing element" which detects a magnetic field. The rotation detector can sense movement, e.g., rotation, of a ferromagnetic object, for example, advance and retreat of magnetic domains of a ring magnet or advance and retreat of gear teeth of a ferromagnetic gear. Similarly, the term "movement detector" can be used to describe either a rotation detector or a magnetic field sensor that can sense different movement, e.g., linear movement, of a ferromagnetic object, for example, linear movement of magnetic domains of a ring magnet or linear movement of gear teeth of a ferromagnetic gear.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" or simply "sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-bias or other magnet, and a magnetic field sensor that senses a magnetic field density of a magnetic field.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

It should be understood that a so-called "comparator" can be comprised of an analog comparator having a two state output signal indicative of an input signal being above or below a threshold level (or indicative of one input signal being above or below another input signal). However the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Signals with pulses are described herein as generated by a magnetic field sensor. In some embodiments, the signals are provided on a communication link to an external processor, for example, a CPU within an automobile, to further process the pulses. As used herein, the term "pulse" is used to describe a signal that begins at a first level or state, transitions rapidly to a second level or state different than the first level, and returns rapidly to the first level.

Ferromagnetic objects described herein can have a variety of forms, including, but not limited to, a ring magnet having one or more pole pair, and a gear having two or more gear teeth. Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects are possible that move linearly.

Referring to FIG. 1, an exemplary magnetic field sensor 10 as may take the form of a rotation detector can be used, for example, to detect passing gear teeth, for example, gear teeth 12a-12c of a ferromagnetic gear or, more generally target 12. A permanent magnet 58 can be placed at a variety of positions proximate to the gear 12, resulting in fluctuations of a magnetic field proximate to the gear as the gear rotates. Use of the above-described magnet 58 results in a so-called "back-bias" arrangement.

The sensor 10 can have a first terminal 14 coupled to a power supply denoted as Vcc and a second terminal 16 coupled to a fixed voltage, for example, a ground voltage, denoted as GND. A third terminal 18 of the sensor 10 permits communication of a sensor output signal 52 to circuits and systems external to the sensor. The sensor output signal 52 can be provided in the form of a voltage signal (as shown in FIG. 1) or a current signal. The illustrated sensor 10 can be considered a three terminal device (i.e., a three wire device) since it has third terminal 18 at which output signal 52 is provided. Sensor 10 can be provided in the form of an integrated circuit (IC), with terminals 14, 16, 18 provided by pins or leads of the IC.

The sensor 10 can include first, second, and third magnetic field sensing elements 20a, 20b, 20c, respectively, here shown to be Hall effect elements. The first Hall effect element 20a generates a first differential voltage signal 24a, 24b, the second Hall effect element 20b generates a second differential voltage signal 26a, 26b, and the third Hall effect element 20c generates a third differential voltage signal 28a, 28b, each having respective AC signal components in response to the rotating gear 12.

While each one of the Hall effect elements 20a, 20b, 20c is shown to be a two terminal device, one of ordinary skill in the art will understand that each of the Hall effect elements 20a, 20b, 20c is actually a four terminal device and the other two terminals of the Hall effect elements can be coupled to receive and pass respective currents as might be provided, for example, by a current source or by a voltage source (not shown).

first differential voltage signal 24a, 24b can be received by a first differential preamplifier 30a, the second differential voltage signal 26a, 26b can be received by a second differential preamplifier 30b, and the third differential voltage signal 28a, 28b can be received by a third differential preamplifier 30c.

First and second amplified signals 32a, 32b generated by the first and second differential preamplifiers 30a, 30b, respectively, are received by a "right" channel amplifier 34a and the second amplified signal 32b and a third amplified signal 32c generated by the second and third differential preamplifiers 30b, 30c, respectively, are received by a "left" channel amplifier 34b. Designations of "right" and "left" are arbitrary.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature. Thus, the sensor 10 can be considered to include a right processing channel (or simply right channel) including amplifier 34a and right detector circuit 36a and a left processing channel (or simply left channel) including amplifier 34b and detector circuit 36b.

It will be appreciated that a "channel" refers generally to processing circuitry associated with one or more magnetic field sensing elements and configured to generate a respective channel signal. While the particular processing circuitry shown in FIG. 1 to provide the right channel circuitry includes right channel amplifier 34a and right channel detector circuit 36a (and similarly the processing circuitry shown in FIG. 1 to provide the left channel circuitry includes legt channel amplifier 34b and left channel detector circuit 36b, such channels can include less, more, or different processing circuitry.

Taking the right channel detector circuit 36a as representative of both of the detector circuits 36a, 36b, the right channel detector circuit 36a includes a threshold detector circuit 40a coupled to receive the signal 38a. The threshold detector circuit 40a is configured to detect positive and negative peaks of the signal 38a, to identify a peak-to-peak value of the signal 38a, and to generate a threshold signal 42a that, for example, takes on a first threshold value at forty percent of the peak-to-peak value of the signal 38a and a second threshold value at sixty percent of the peak-to-peak value of the signal 38a. A comparator 44a is coupled to receive the threshold signal 42a and is also coupled to receive the signal 38a. As a result, the comparator 44a generates a binary, two-state, signal 46a that has transitions when the signal 38a crosses the first and second thresholds.

A signal 46b generated by the left channel detector circuit 36b is generated in the same way as the signal 46a. However, since the magnetic field sensing elements 20a, 20b contribute to the signal 46a, while the magnetic field sensing elements 20b, 20c contribute to the signal 46b, it should be appreciated that the signals 46a, 46b have edges that differ in time (which is equivalent to phase for a particular signal frequency, i.e., particular rotation speed). Stated differently, the channels are configured to generate respective phase separated channel signals 46a, 46b.

Movement speed of the target 12 can be detected in accordance with the frequency of either of the phase separated channel signals 46a, 46b. In this way channel signals 46a, 46b can be considered to contain redundant target speed information. It should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

While the sensor 10 is shown to include the detector circuits 36a, 36b, each having a particular topology, described above as peak-to-peak percentage detectors (threshold detectors), it should be understood that any form of detectors may be used, such as peak-referenced detectors (peak detectors).

The sensor 10 can include an output protocol module 48 coupled to receive and process the phase separated signals 46a, 46b and configured to generate output signal 53 which includes distinguishable pulses associated with each of the channels (i.e., the left channel and the right channel). Stated differently, the output signal 53 contains information about both of the phase separated channel signals 46a, 46b and this information about one channel is distinguishable from the information about the other channel.

More particularly, the sensor output signal 53 may include a first plurality of pulses associated with a first one of the channel signals 46a and a second plurality of pulses associated with a second one of the channel signals 46b, with each of the pluralities of pulses having a different characteristic. For example, the first plurality of pulses of the sensor output signal 53 can have a first signal level and the second plurality of pulses of the sensor output signal can have a second signal level, different than the first signal level. As another example, the first plurality of pulses of the sensor output signal 53 can have a first pulse width and the second plurality of pulses of the sensor output signal can have a second pulse width, different than the first pulse width. The output protocol module 48 can be operable to generate output signal formats described in conjunction with figures below.

In the illustrated three wire sensor 10, the output protocol module 48 can include an output protocol processor 48a and an output driver 48b, as may take the form of an open-drain output as shown. In this configuration, the driver 48b may include a bipolar transistor having a drain terminal coupled to Vcc through a pull up resistor 62, as shown.

Figure 1A:
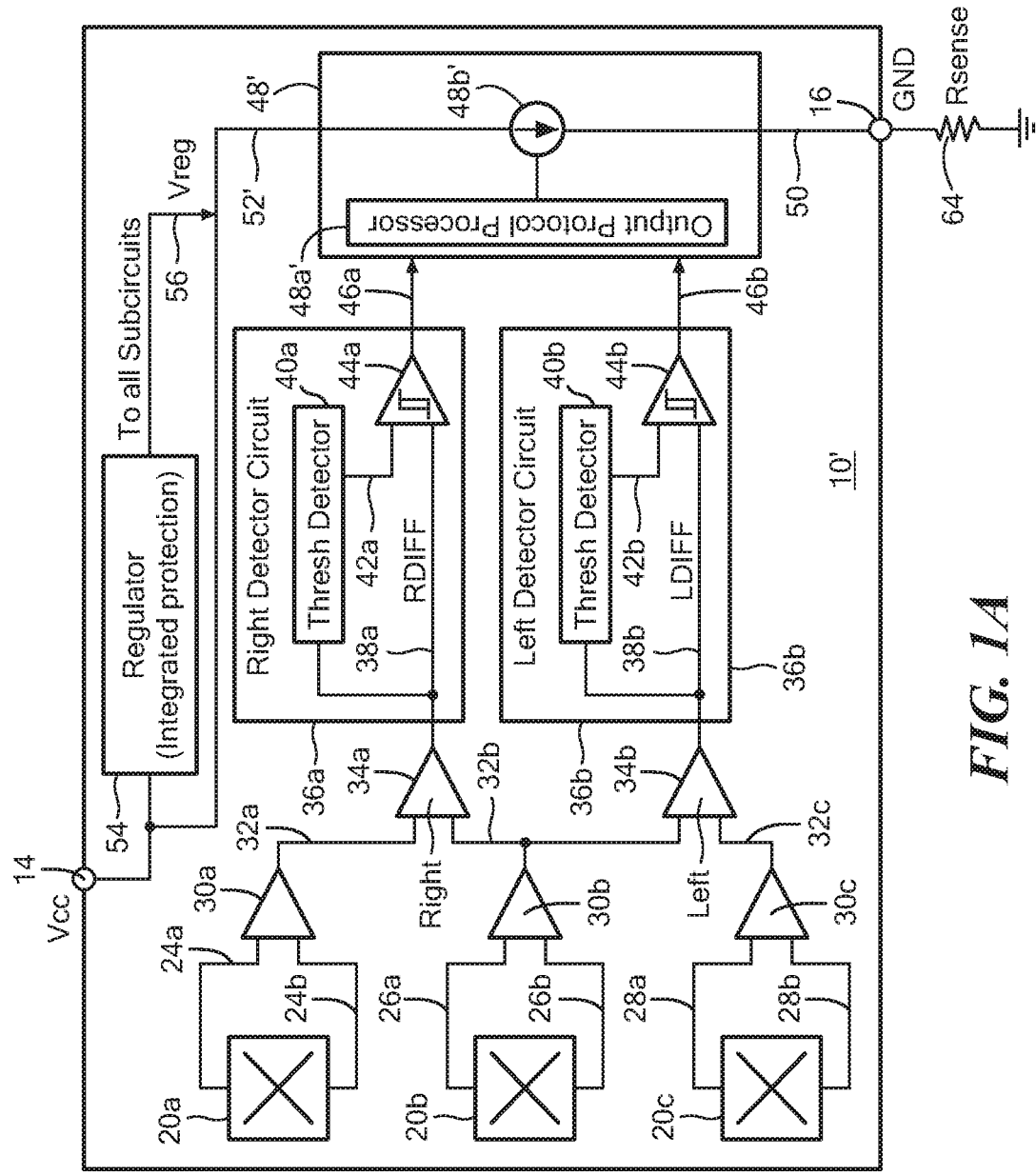
FIG. 1A shows a two wire magnetic field sensor according to the disclosure.
Figure 1A:
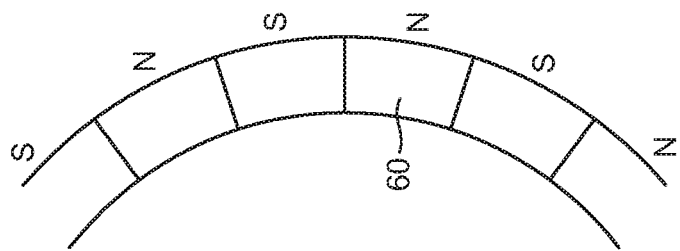

Referring also to FIG. 1A, an alternative magnetic field sensor 10' as may take the form of a rotation detector can be used to detect rotation of a ring magnet 60 having at least one north pole and at least one south pole. Thus, the sensor 10' differs from the sensor 10 of FIG. 1 in that the magnet 58 is omitted and gear 12 is replaced by ring magnet 60.

The sensor 10' further differs from the sensor 10 of FIG. 1 in that sensor 10' is a so-called two terminal device (or two wire device), for which an output signal 52' is provided in the form of a current at the two terminal power connection, superimposed upon the power supply voltage, Vcc, which current may be detected across a sense resistor 64. To this end, an output protocol module 48' can include an output protocol processor 48a' and an output driver 48b', as may take the form of voltage-controlled current source. Various circuitry are possible to implement the voltage controlled current source 48b' such as an operational amplifier controlling current through a pass element such as bipolar transistor. While the sense resistor 64 is shown coupled to the GND terminal 16, the sense resistor may alternatively be coupled to the Vcc terminal 14. In embodiments in which the sensor 10' is provided in the form of an integrated circuit (IC), terminals 14, 16, are provided by pins or leads of the IC.

It will be appreciated that in embodiments in which signal level is used to distinguish the first plurality of pulses of the sensor output signal from the second plurality of pulses of the sensor output signal (i.e., to distinguish the channel signals), it may be desirable to provide the output signal in the form of a current as shown in FIG. 1A, since generally the output driver 48b of FIG. 1 provides either a high or low output voltage level, but not intermediate voltage levels. In other embodiment however, circuitry can be provided to generate the voltage output signal 53 of FIG. 1 with different voltage levels to distinguish the channel signals.

While the embodiments of FIGS. 1 and 1A both include three magnetic field sensing elements 20a, 20b, 20c, coupled in the same manner to generate signals 38a, 38b (i.e., the magnetic field signal 32a is combined with magnetic field signal 32b to generate differential signal 38a and magnetic field signal 32b is combined with magnetic field signal 32c to generate differential signal 36b, such that the center element 20b is "shared" by the two channels), it will be appreciated that other numbers and configurations of sensing element(s) and/or processing channels can be used. By way of non-limiting examples, channels can be based on (i.e., can process) signals from separate (i.e., not differentially combined) magnetic field sensing elements or some channels can be based on signals from separate magnetic field sensing elements and other channels can be based on differentially combined signals from a plurality of magnetic field sensing elements.

Figure 1B:
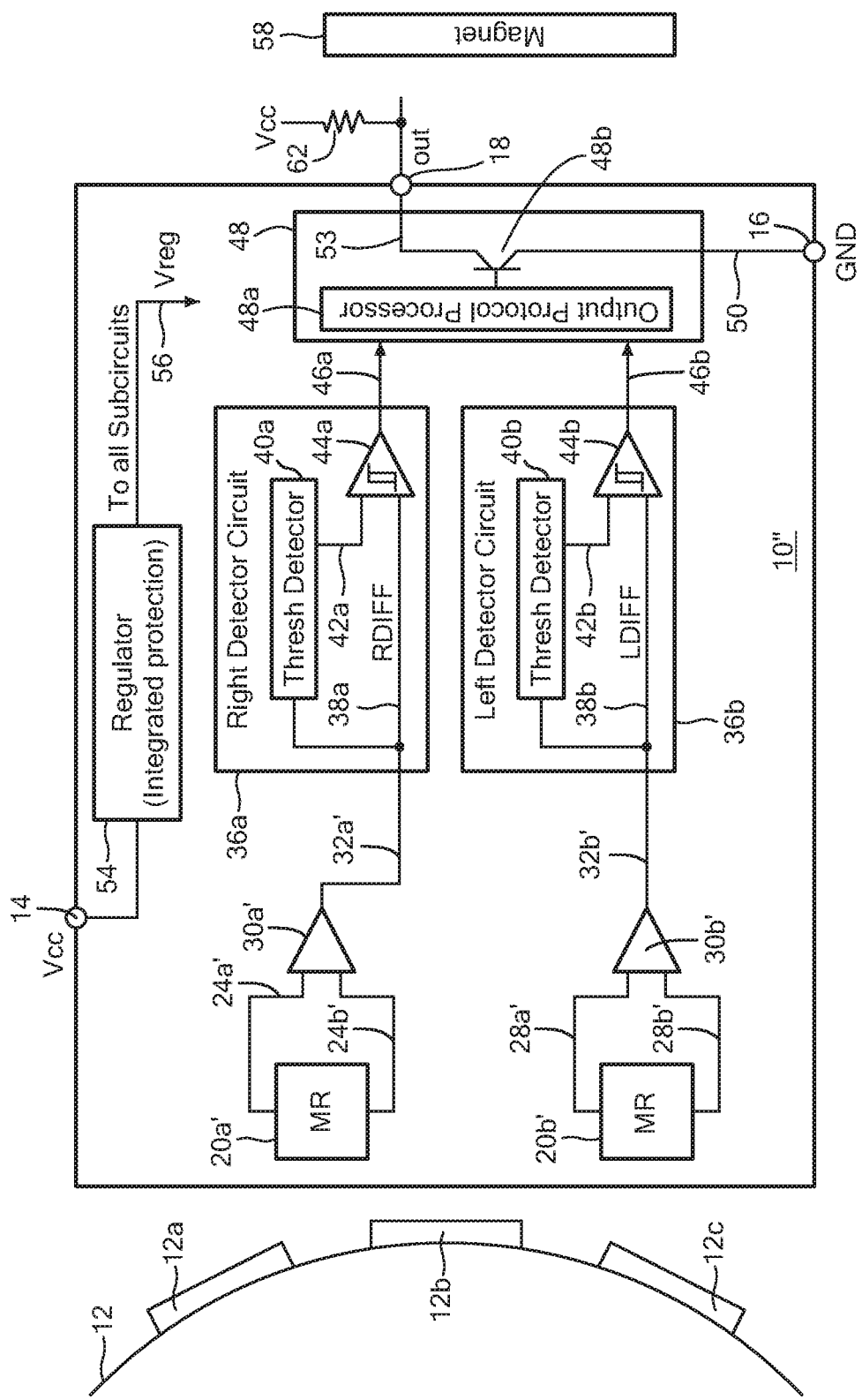
FIG. 1B shows an alternative three wire magnetic field sensor according to the disclosure.

For example and referring also to FIG. 1B, an alternative magnetic field sensor 10" as may take the form of a rotation detector to detect rotation of target 12 includes magnetic field sensing elements 20a', 20b' as may take the form of magnetoresistance elements as illustrated or other types of magnetic field sensing elements including Hall effect elements. In an embodiment, sensing elements 20a', 20b' may each take the form of a bridge configuration containing a plurality of magnetoresistance elements, with each such bridge spaced from the other. Each element 20a', 20b' can provide a respective differential signal 24a', 24b', 28a', 28b' to a respective amplifier 30a', 30b' as shown. Amplifiers 30a', 30b' in turn can provide respective input signals 32a', 32b' to right and left detector circuits 36a, 36b, which detector circuits generate phase separated channel signals 46a, 46b.

Figure 2:
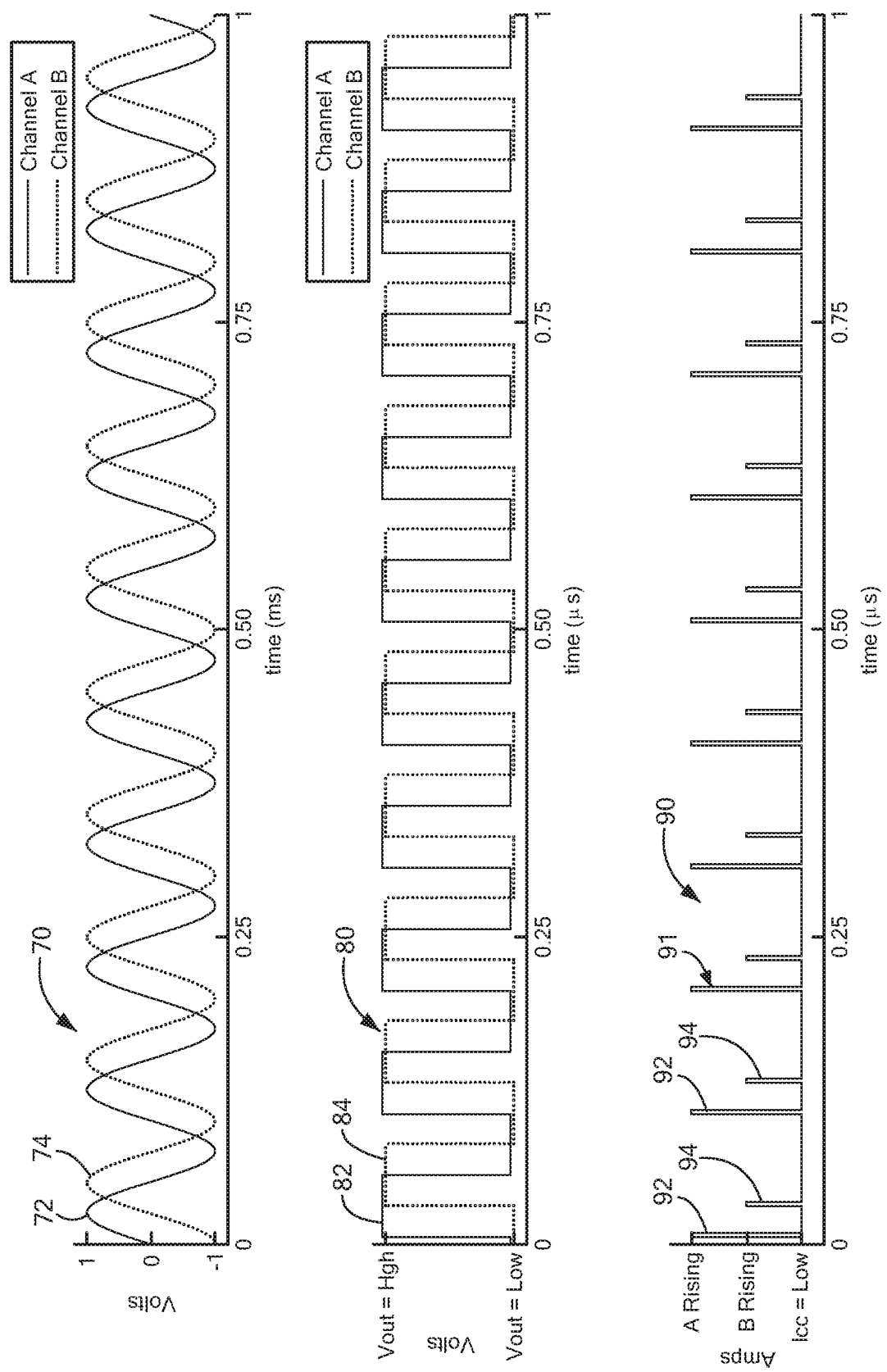
FIG. 2 shows example waveforms, including magnetic field signals, phase separated channel signals, and a sensor output signal including current pulses associated with each of the phase separated channel signals that are distinguishable based on signal level.

Referring to FIG. 2, graphs 70, 80, 90 have the same horizontal axes with scales in arbitrary units of time. The vertical axes of graphs 70, 80 have scales in units of volts and the vertical axis of graph 90 has a scale in units of amps. In the graph 70, signals 72, 74 are indicative of signals 38a, 38b. Threshold 76 is indicative, for example, of sixty percent of a peak-to-peak value of either one of the signals 72, 74, and threshold 78 is indicative, for example, of forty percent of a peak-to-peak value of either one of the signals 72, 74. The thresholds 76, 78 can be generated, for example, by one of (or both of) the threshold detectors 40a, 40b.

In the graph 80, signals 82, 84 are examples of phase separated channel signals 46a, 46b of FIG. 1A. The signals 82, 84 can be two state signals having transitions when the signals 72, 74 cross thresholds 76, 78. More particularly, each channel signal 46a, 46b can have positive and negative transitions (i.e., rising and falling edges), as shown.

It will be appreciated that in the embodiments of FIGS. 1, 1A, and 1B, the direction of rotation of the target can be determined by which channel signal leads and which channel signal lags. For example, signal 82 leading signal 84 can indicate a first direction of target rotation and signal 82 lagging signal 84 can indicate a second direction of target rotation. Thus, the channel signals 82, 84 can be processed to determine the direction of rotation of the target.

In the graph 90, a current signal 91 can be the same as or similar to the sensor output signal 52' of FIG. 1A. Thus, the sensor output signal 91 can include a first plurality of pulses 92 associated with the first channel signal 82 and a second plurality of pulses 94 associated with the second channel signal 84, which second plurality of pulses is distinguishable from the first plurality of pulses. In the embodiment of FIG. 2, the first plurality of pulses 92 has a first signal level and the second plurality of pulses 94 has a second signal level, different than the first signal level.

More particularly, each of the first pulses 92 occurs in response to (i.e., proximate to a time of) a positive transition of the respective channel signal 82 and each of the second pulses 94 occurs in response to (i.e., proximate to a time of) a like transition of the respective channel signal 84, as shown. It will be appreciated that the first and second pulses 92, 94 could alternatively occur in response to (i.e., proximate to a time of) a negative transition of the respective channel signal 82, 84. Thus, the pulses 92, 94 occur at each full cycle of the signals 72, 74, respectively. A rate of pulses 92 can be indicative of a speed of rotation of the target and likewise a rate of pulses 94 can be indicative of the speed of rotation of the target.

Providing the sensor output signal 91 with information about both of the channel signals 82, 84 in a manner by which information about one channel can be distinguished, or differentiated from information about the other channel signal is desirable in order to permit the speed of movement of the target to be determined with redundancy. In other words, if one channel were to fail, the sensor output signal 91 would still contain target speed information provided by the other channel. Furthermore, a significant advantage is realized by encoding information about both channel signals 82, 84 in a single sensor output signal 91, thereby eliminating the need for an additional connection (i.e., pin) of the sensor.

It will be appreciated that various circuitry and techniques are possible for implementing the output protocol processor 48a' (FIG. 1A) to provide the sensor output signal 91. In an embodiment, the processor 48a' generates each set of pulses 92, 94 as a separate signal (e.g., an edge strip circuit, as may include an XOR gate and delay circuit, can be used to generate a short pulse in response to each rising and/or falling edge of signals 46a, 46b) and combines the separate pulse train signals with a logical AND operator. Additional circuitry can be implemented to ensure that the phase separation between the sets of pulses 92, 94 does not go to zero, as may be implemented with level checking or other error checking circuitry or techniques.

Figure 2A:
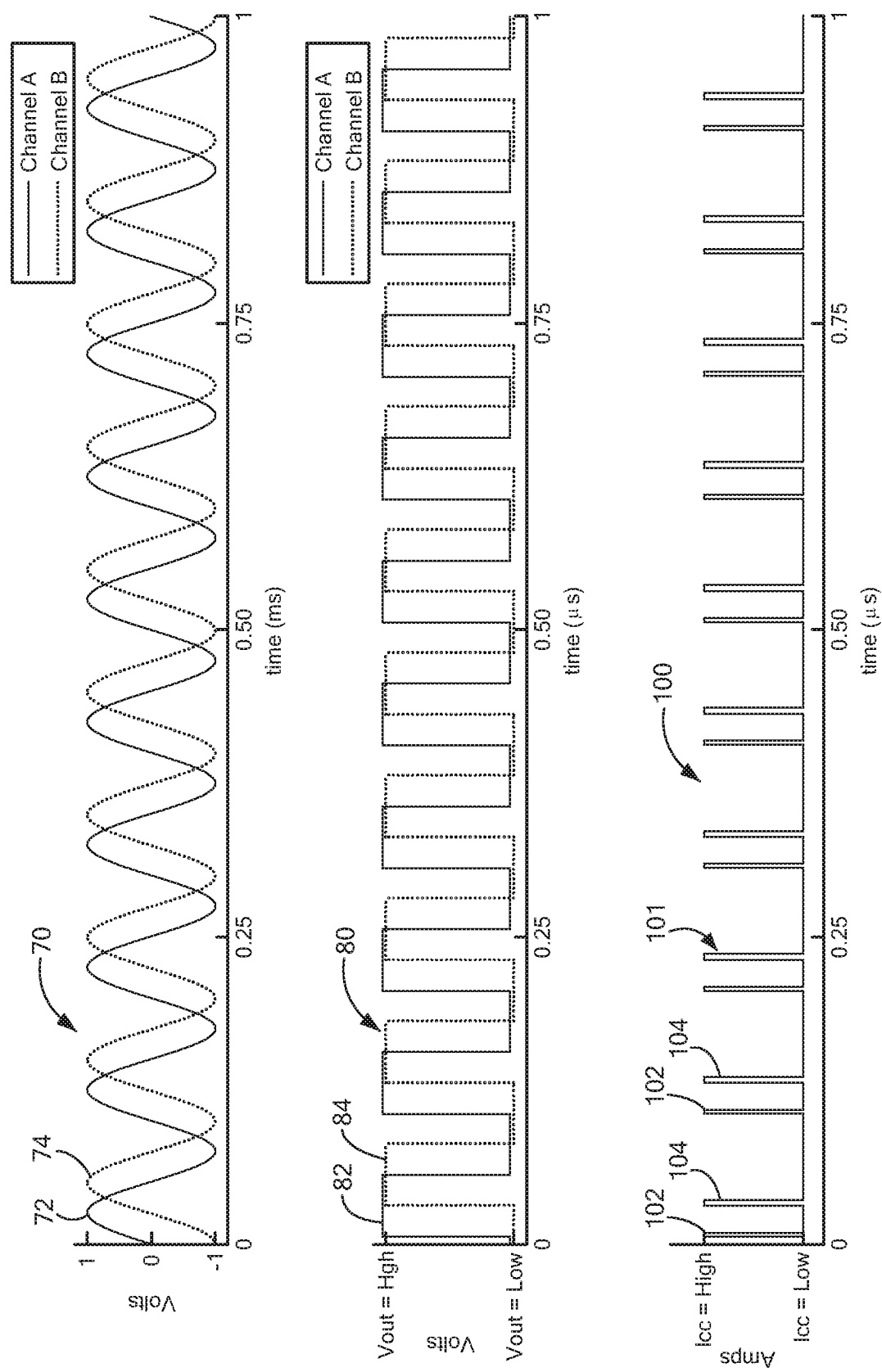
FIG. 2A shows example waveforms, including magnetic field signals, phase separated channel signals, and a sensor output signal including current pulses associated with each of the phase separated channel signals, that are distinguishable based on pulse width.

Referring to FIG. 2A, graphs 70, 80, 100 have the same horizontal axes with scales in arbitrary units of time. Graphs 70, 80 are as described above in connection with FIG. 2. Thus, in the graph 70, signals 72, 74 are indicative of signals 38b a, 38b and in the graph 80, signals 82, 84 are indicative of phase separated channel signals 46a, 46b.

In the graph 100, a current signal 101 illustrates an alternative sensor output signal that can be the same as or similar to the sensor output signal 52' of FIG. 1A. Thus, the sensor output signal 101 can include a first plurality of pulses 102 associated with the first channel signal 82 and a second plurality of pulses 104 associated with the second channel signal 84, which second plurality of pulses is distinguishable from the first plurality of pulses. In the embodiment of FIG. 2A, the first plurality of pulses 102 has a first pulse width and the second plurality of pulses 104 has a second pulse width, different than the first pulse width. By way of an example, the pulse width of first pulses 102 can shorter, e.g., forty-five microseconds, and the pulse width of the second pulses 104 can be longer, e.g., ninety microseconds.

More particularly, each of the first pulses 102 occurs in response to (i.e., proximate to a time of) a positive transition of the respective channel signal 82 and each of the second pulses 104 occurs in response to (i.e., proximate to a time of) a like transition of the respective channel signal 84, as shown. Thus, the pulses 102, 104 occur at each full cycle of the signals 72, 74, respectively. A rate of the pulses 102 and likewise a rate of pulse 104 can be indicative of a speed of rotation of the target.

Figure 2B:
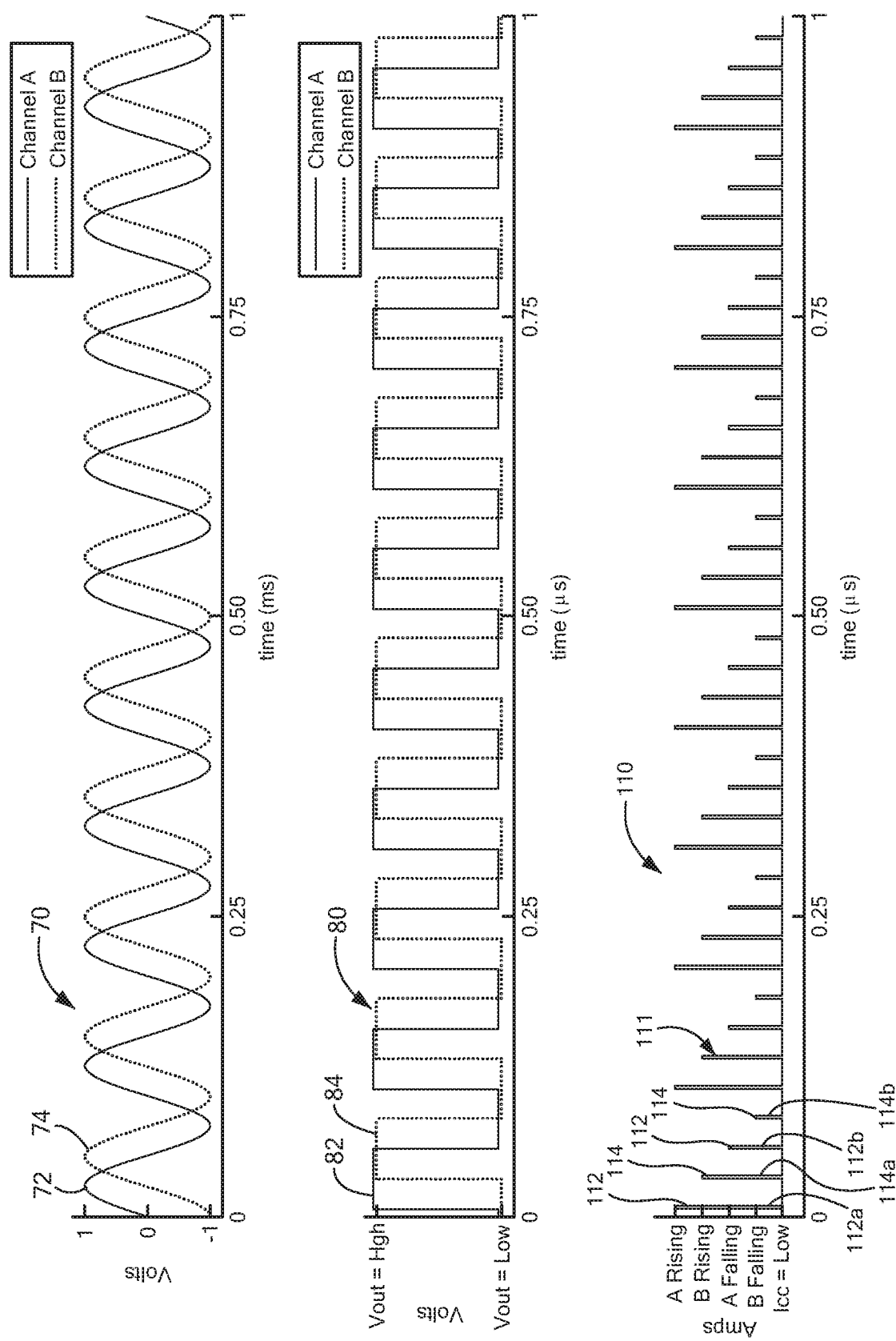
FIG. 2B shows example waveforms, including magnetic field signals, phase separated channel signals, and a sensor output signal including current pulses associated with each of the phase separated channel signals, that are distinguishable based on signal level and include rising and falling edge channel signal information encoded by signal level.

Referring to FIG. 2B, graphs 70, 80, 110 have the same horizontal axes with scales in arbitrary units of time. Graphs 70, 80 are as described above in connection with FIG. 2. Thus, in the graph 70, signals 72, 74 are indicative of signals 38a, 38b and in the graph 80, signals 82, 84 are indicative of phase separated channel signals 46a, 46b, respectively.

In the graph 110, a current signal 111 illustrates an alternative sensor output signal that can be the same as or similar to the sensor output signal 52' of FIG. 1A. Thus, the sensor output signal 111 can include a first plurality of pulses 112 associated with the first channel signal 82 and a second plurality of pulses 114 associated with the second channel signal 84, which second plurality of pulses is distinguishable from the first plurality of pulses.

In the embodiment of FIG. 2B, the first plurality of pulses 112 can occur proximate to a time of both the positive and negative transitions of respective channel signal 82 and thus, can include first pulses 112a proximate to a time of positive transitions of channel signal 82 and second pulses 112b proximate to a time of negative transitions of channel signal 82. Similarly, the second plurality of pulses 114 can occur proximate to a time of both the positive and negative transitions of respective channel signal 84 and thus, can include first pulses 114a proximate to a time of positive transitions of channel signal 84 and second pulses 114b proximate to a time of negative transitions of channel signal 84. Thus, pulses 112a, 112b, occur at each half cycle of respective channel signal 82 and pulses 114a, 114b occur at each half cycle of respective channels signal 84. A rate of the pulses 112 and likewise a rate of pulses 114 can be indicative of a speed of rotation of the target.

In the embodiment of FIG. 2B, the first plurality of pulses 112a, 112b have first respective signal levels and the second plurality of pulses 114a, 114b have second respective signal levels, different than the first signal levels. With this arrangement, first pulses 112a, 112b can be distinguished from second pulses 114a, 114b. Further, each of the first pulses that occurs proximate to a time of a positive transition of the respective channel signal 82 (i.e., pulses 112a) has a first predetermined signal level and each of the first pulses that occurs proximate to a time of a negative transition of the respective channel signal 84 (i.e., pulses 112b) has a second predetermined signal level, different than the first predetermined signal level. In this way, the sensor output signal 111 encodes not only channel but also transition direction by signal level or stated differently, in the embodiment of FIG. 2B, the channel signals are differentiated from each other by signal level and the positive transitions and negative transitions of a channel signal are differentiated from each other by signal level.

Figure 2C:
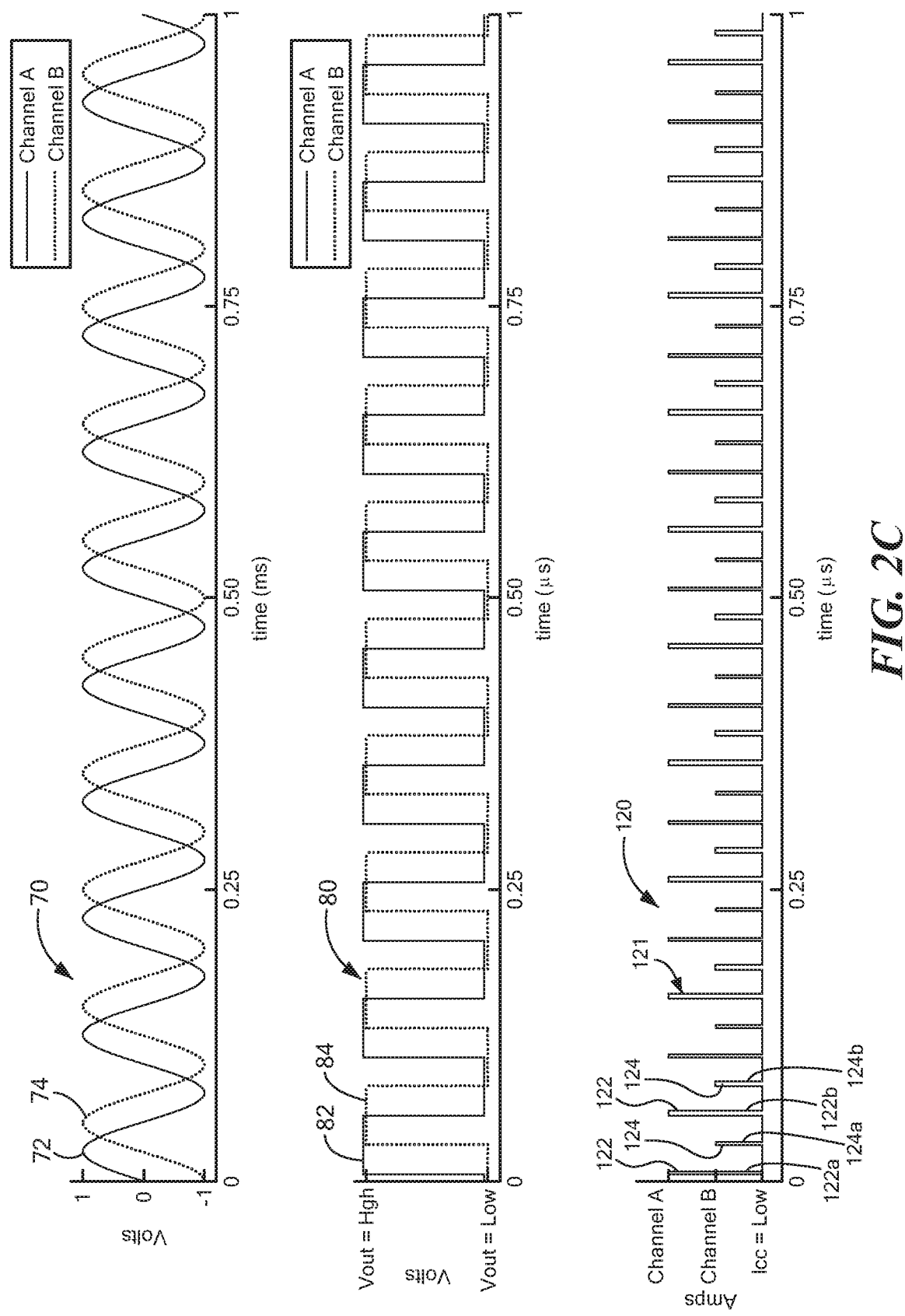
FIG. 2C shows example waveforms, including magnetic field signals, phase separated channel signals, and a sensor output signal including current pulses associated with each of the phase separated channel signals, that are distinguishable based on signal level and pulse width and include rising and falling edge channel signal information encoded by pulse width.

Referring to FIG. 2C, graphs 70, 80, 120 have the same horizontal axes with scales in arbitrary units of time. Graphs 70, 80 are as described above in connection with FIG. 2. Thus, in the graph 70, signals 72, 74 are indicative of magnetic field signals 38a, 38b and in the graph 80, signals 82, 84 are indicative of phase separated channel signals 46a, 46b.

In the graph 120, a current signal 121 illustrates an alternative sensor output signal that can be the same as or similar to the sensor output signal 52' of FIG. 1A. Thus, the sensor output signal 121 can include a first plurality of pulses 122 associated with the first channel signal 82 and a second plurality of pulses 124 associated with the second channel signal 84, which second plurality of pulses is distinguishable from the first plurality of pulses.

In the embodiment of FIG. 2C, the first plurality of pulses 122 can occur proximate to a time of both the positive and negative transitions of respective channel signal 82 and thus, can include first pulses 122a proximate to a time of the positive transitions of channel signal 82 and second pulses 122b proximate to a time of the negative transitions of channel signal 82. Similarly, the second plurality of pulses 124 can occur proximate to a time of both the positive and negative transitions of respective channel signal 84 and thus, can include first pulses 124a proximate to a time of the positive transitions of channel signal 84 and second pulses 124b proximate to a time of the negative transitions of channel signal 84. Thus, pulses 122a, 122b, occur at each half cycle of respective channel signal 82 and pulses 124a, 124b occur at each half cycle of respective channels signal 84. A rate of the pulses 122, 124 can be indicative of a speed of rotation of the target.

In the embodiment of FIG. 2C, the first plurality of pulses 122a, 122b have a first signal level and the second plurality of pulses 124a, 124b have a second signal level, different than the first signal level. With this arrangement, first pulses 122a, 122b can be distinguished from second pulses 124a, 124b by their respective signal levels. Further, each of the first pulses that occurs proximate to a time of a positive transition of the respective channel signal 82 (i.e., pulses 122a) has a first predetermined pulse width and each of the first pulses that occurs proximate to a time of a negative transition of the respective channel signal 82 (i.e., pulses 122b) has a second predetermined pulse width, different than the first predetermined pulse width. In this way, the output signal 121 encodes channel by signal level and encodes transition direction by pulse width or stated differently, in the embodiment of FIG. 2C, the channel signals are differentiated from each other by signal level and the positive transitions and negative transitions of a respective channel signal are differentiated from each other by pulse width.

Figure 2D:
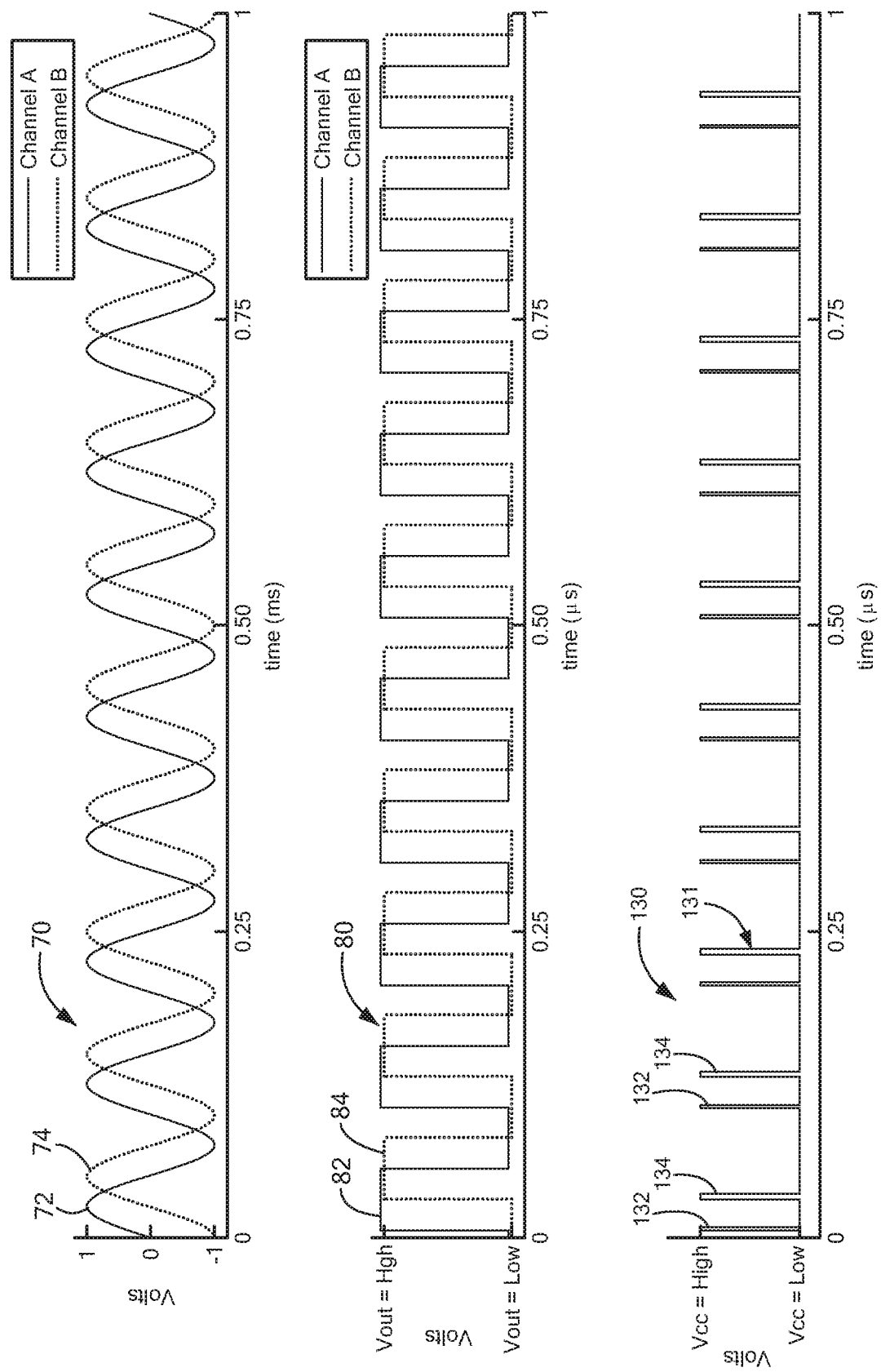
FIG. 2D shows example waveforms, including magnetic field signals, phase separated channel signals, and a sensor output signal including voltage pulses associated with each of the phase separated channel signals, that are distinguishable based on pulse width.

Referring to FIG. 2D, graphs 70, 80, 130 have the same horizontal axes with scales in arbitrary units of time. Graphs 70, 80 are as described above in connection with FIG. 2. Thus, in the graph 70, signals 72, 74 are indicative of signals 38a, 38b and in the graph 80, signals 82, 84 are indicative of phase separated channel signals 46a, 46b.

In the graph 130, a voltage signal 131 illustrates an alternative sensor output signal that can be the same as or similar to the sensor output signal 53 of FIG. 1, in the form of a voltage signal as may be provided at pin 18 of sensor 10. Output signal 131 can include a first plurality of pulses 132 associated with the first channel signal 82 and a second plurality of pulses 134 associated with the second channel signal 84, which second plurality of pulses is distinguishable from the first plurality of pulses, here by having a different pulse width. More particularly, each of the first pulses 132 occurs in response to (i.e., proximate to a time of) a positive transition of the respective channel signal 82 and each of the second pulses 134 occurs in response to (i.e., proximate to a time of) a like transition of the respective channel signal 84, as shown.

Figure 3:
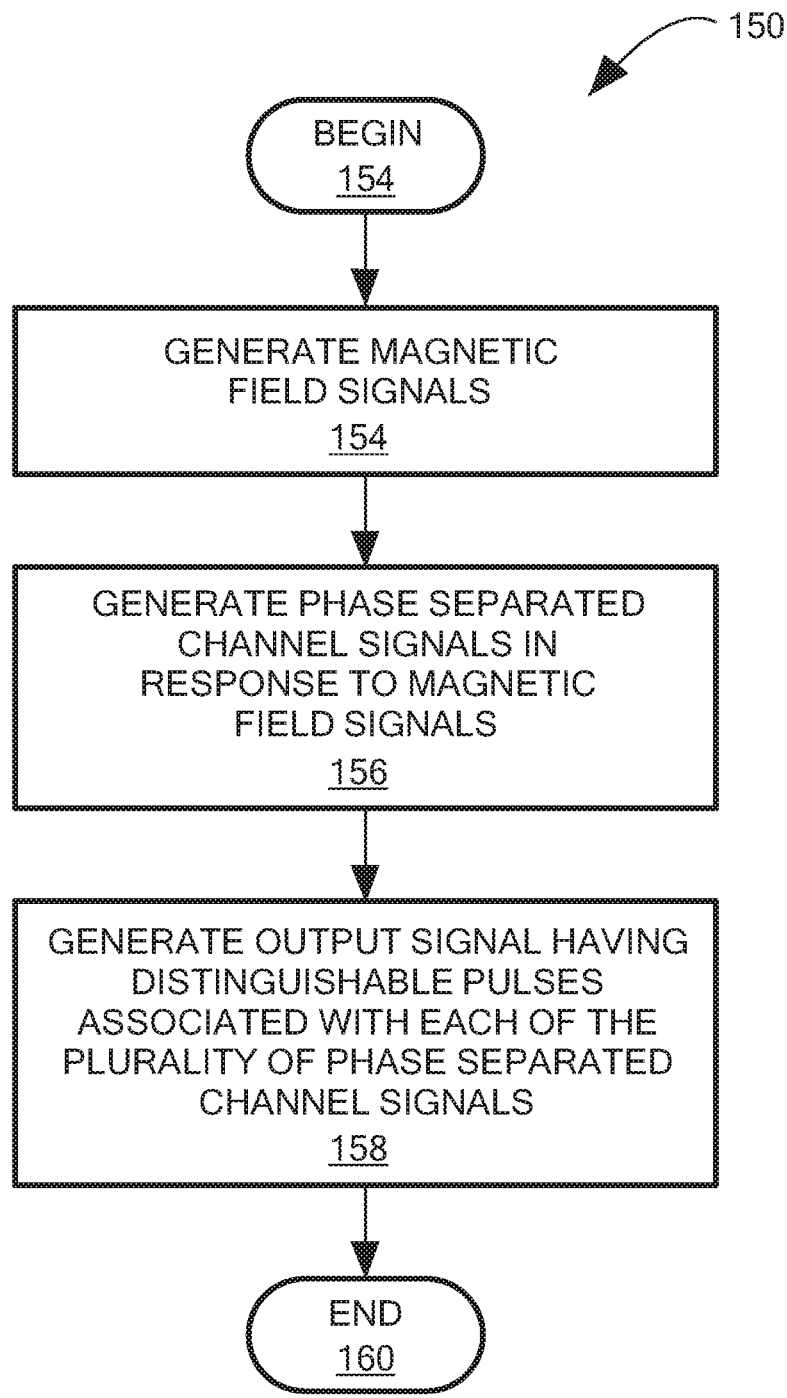
FIG. 3 is a flow diagram of a method of communicating a plurality of phase separated channel signals over a single connection according to the disclosure.

Referring to the flow diagram of FIG. 3, a method 150 of communicating a plurality of phase separated signals over a single connection begins at block 152, following which a plurality of magnetic field signals are generated in block 154. Generating the magnetic field signals may be accomplished with magnetic field sensing elements, such as the Hall effect elements 20a, 20b, 20c of FIGS. 1 and 1A or the magnetoresistance elements 20a', 20b' in FIG. 1B, for example.

In block 156, the magnetic field signals are used to generate a plurality of phase separated channel signals, as may be accomplished with the right and left channel processing circuitry shown in FIG. 1. More particularly, a right processing channel, as may include differential amplifier 34a and right detector circuit 36a, may generate a right channel signal 46a and a left processing channel, as may include differential amplifier 34b and left detector circuit 36b, may generate a left channel signal 46b having a phase separation with respect to the right channel signal 46a.

An output signal of the sensor is generated at block 158 to include pulses associated with both of the phase separated channel signals, but which pulses are distinguishable from each other. Thus, as may be achieved by the output protocol module 48 of FIG. 1 or 48' of FIG. 1A, the output signal can include a first plurality of pulses associated with the first channel signal, such first pulses having a first characteristic, and a second plurality of pulses associated with the second channel signal, which second pulses have a second characteristic, different than the first characteristic. As explained above, example distinguishable pulse characteristics can include signal level and/or pulse width. As is also explained above, the sensor output signal can be provided in various formats including a voltage signal provided on a dedicated signal connection in a three wire sensor configuration or a current signal superimposed on a power connection in a two wire sensor configuration for example.

All references cited herein are hereby incorporated herein by reference in their entirety.

Having described preferred embodiments, it will now become apparent to one of ordinary skill in the art that other embodiments incorporating their concepts may be used.

For example, while the illustrated embodiments contain two processing channels which generate respective phase separated channel signals, it will be appreciated that more than two processing channels can be used, in which case the sensor output signal contains distinguishable pulses associated with each of the three or more processing channels. Furthermore, features shown in connection with the example embodiments can be used in connection with other embodiments. For example, a two wire device as shown in FIG. 1A can be used with the target type (gear 12) shown in FIG. 1 and vise versa.

It is felt therefore that these embodiments should not be limited to disclosed embodiments, but rather should be limited only by the spirit and scope of the appended claims.

What is claimed is:

1. A magnetic field sensor, comprising:
    a plurality of magnetic field sensing elements operable to generate a plurality of magnetic field signals indicative of a magnetic field associated with an object;
    a plurality of channels coupled to receive one or more of the plurality of magnetic field signals and configured to generate a respective plurality of phase separated channel signals; and
    an output circuit comprising an output protocol processor and an output driver, wherein the output driver comprises either a bipolar transistor having a drain terminal configured to be coupled to a power supply through a pull up resistor or a voltage-controlled current source, the output circuit coupled to receive the plurality of phase separated channel signals and configured to generate a sensor output signal comprising distinguishable pulses associated with each of the plurality of phase separated channel signals.

2. The magnetic field sensor of claim 1, wherein the sensor output signal comprises a first plurality of pulses associated with a first one of the plurality of phase separated channel signals and a second plurality of pulses associated with a second one of the plurality of phase separated channel signals, wherein the first plurality of pulses has a first characteristic and the second plurality of pulses has a second characteristic different than the first characteristic.

3. The magnetic field sensor of claim 2, wherein the first plurality of pulses of the sensor output signal comprises a first signal level and the second plurality of pulses of the sensor output signal comprises a second signal level different than the first signal level.

4. The magnetic field sensor of claim 2, wherein the first plurality of pulses of the sensor output signal comprises a first pulse width and the second plurality of pulses of the sensor output signal comprises a second pulse width different than the first pulse width.

5. The magnetic field sensor of claim 1, wherein the sensor is provided as an integrated circuit comprising a two wire power connection and wherein the sensor output signal is provided on the two wire power connection.

6. The magnetic field sensor of claim 1, wherein the sensor is provided as an integrated circuit comprising a two wire power connection and a separate output connection and wherein the sensor output signal is provided on the separate output connection.

7. The magnetic field sensor of claim 1, wherein each of the plurality of phase separated channel signals comprises transitions indicative of a rate of movement of the object.

8. The magnetic field sensor of claim 1, wherein each of the plurality of circuit channels comprises a threshold detector circuit configured to compare the received one or more magnetic field signals to a threshold level to generate the respective channel signal.

9. The magnetic field sensor of claim 8, wherein the threshold detector circuit comprises a peak-referenced detector circuit or a peak-to-peak percentage threshold detector circuit.

10. The magnetic field sensor of claim 1, wherein the plurality of magnetic field sensing elements comprises one or more Hall effect elements or magnetoresistance elements.

11. The magnetic field sensor of claim 1, further comprising a back bias magnet to generate a magnetic field, wherein the object comprises a ferromagnetic object and wherein movement of the object affects the magnetic field detected by the plurality of magnetic field sensing elements.

12. A method of communicating a plurality of phase separated signals over a single connection of a magnetic field sensor, comprising:
    generating a plurality of magnetic field signals indicative of to a magnetic field associated with an object;
    processing the plurality of magnetic field signals with a plurality of channels configured to generate a respective plurality of phase separated channel signals; and
    generating, by an output circuit comprising an output protocol processor and an output driver comprising either a bipolar transistor having a drain terminal configured to be coupled to a power supply through a pull up resistor or a voltage-controlled current source, a sensor output signal comprising distinguishable pulses associated with each of the plurality of phase separated channel signals for coupling to the single connection.

13. The method of claim 12, wherein generating the sensor output signal comprises generating a first plurality of pulses associated with a first one of the plurality of phase separated channel signals and a second plurality of pulses associated with a second one of the plurality of phase separated channel signals, wherein the first plurality of pulses has a first characteristic and the second plurality of pulses has a second characteristic different than the first characteristic.

14. The method of claim 13, wherein generating the first plurality of pulses comprises generating the first plurality of pulses having a first signal level and the wherein generating the second plurality of pulses comprises generating the second plurality of pulses having a second signal level different than the first signal level.

15. The method of claim 13, wherein generating the first plurality of pulses comprises generating the first plurality of pulses having a first pulse width and the wherein generating the second plurality of pulses comprises generating the second plurality of pulses having a second pulse width different than the first pulse width.

16. The method of claim 12, wherein generating the sensor output signal comprises providing the sensor output signal in the form of a current on a two wire power connection of the sensor.

17. The method of claim 12, wherein generating the sensor output signal comprises providing the sensor output signal on a dedicated output connection of the sensor.

18. Apparatus comprising:
  means for generating a plurality of magnetic field signals indicative of a magnetic field associated with movement of an object;
  means for generating a plurality of phase separated channel signals in response to the plurality of magnetic field signals; and
  output means including output protocol processing means and output driving means, the output means coupled to the channel signal generating means, for generating a sensor output signal comprising distinguishable pulses associated with each of the plurality of phase separated channel signals, output circuit comprising an output protocol processor and an output driver, wherein the output driving means comprises either a bipolar transistor having a drain terminal configured to be coupled to a power supply through a pull up resistor or a voltage-controlled current source.

19. The apparatus of claim 18, wherein the output means comprises means for providing the output signal with a first plurality pulses associated with a first one of the plurality of phase separated channel signals and a second plurality of pulses associated with a second one of the plurality of phase separated channel signals, wherein the first plurality of pulses has a first characteristic and the second plurality of pulses has a second characteristic different than the first characteristic.

20. The apparatus of claim 19, wherein the first plurality of pulses of the sensor output signal comprises a first signal level and the second plurality of pulses of the sensor output signal comprises a second signal level different than the first signal level.

21. The apparatus of claim 19, wherein the first plurality of pulses of the sensor output signal comprises a first pulse width and the second plurality of pulses of the sensor output signal comprises a second pulse width different than the first pulse width.

\* \* \* \* \*

UNITED STATES PATENT AND TRADEMARK OFFICE
CERTIFICATE OF CORRECTION

PATENT NO. : 10,782,366 B2
APPLICATION NO. : 15/729943
DATED : September 22, 2020
INVENTOR(S) : Logan Stewart Page 1 of 2

It is certified that error appears in the above-identified patent and that said Letters Patent is hereby corrected as shown below:

On the Title Page

ABSTRACT delete "different signals levels" and replace with --different signal level--.

In the Specification

Column 2, Line 10 delete "different signals levels" and replace with --different signal level--.

Column 5, Line 26 delete "an analog" and replace with --analog--.

Column 5, Line 45 delete "However" and replace with --However,--.

Column 6, Line 49 delete "first" and replace with --First--.

Column 7, Line 14 delete "legt" and replace with --left--.

Column 7, Line 15 delete "36b," and replace with --36b),--.

Column 7, Line 31 delete "two-state," and replace with --two-state--.

Column 8, Line 56 delete "embodiment however" and replace with --embodiments, however--.

Column 10, Line 36 delete "38b a" and replace with --38a--.

Column 10, Lines 49-50 delete "can shorter" and replace with --can be shorter--.

Column 10, Line 60 delete "pulse 104" and replace with --pulses 104--.

Column 11, Line 23 delete "channels" and replace with --channel--.

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,782,366 B2

Column 12, Line 7 delete "channels" and replace with --channel--.

Column 13, Line 35 delete "vise versa" and replace with --vice versa--.

Column 14, Line 42 delete "of to a" and replace with --of a--.

Column 14, Line 66 delete "and the wherein" and replace with --and wherein--.

Column 15, Line 5 delete "and the wherein" and replace with --and wherein--.

Column 16, Line 9 delete "plurality pulses" and replace with --plurality of pulses--.